United States Patent [19]

Blacka et al.

[11] Patent Number: 5,169,057
[45] Date of Patent: Dec. 8, 1992

[54] METHOD FOR SOLDERING AND APPARATUS THEREFOR

[75] Inventors: Robert J. Blacka, Pennsauken; Francis J. Verderame, Berlin, both of N.J.

[73] Assignee: EMC Technology, Inc., Cherry Hill, N.J.

[21] Appl. No.: 767,744

[22] Filed: Sep. 30, 1991

Related U.S. Application Data

[62] Division of Ser. No. 391,817, Aug. 10, 1989, Pat. No. 5,052,155.

[51] Int. Cl.⁵ .................................................. B23K 1/20
[52] U.S. Cl. .................................... 228/205; 228/180.2
[58] Field of Search ..................... 228/205, 214, 180.2

[56] References Cited

U.S. PATENT DOCUMENTS

| | | | |
|---|---|---|---|
| 3,818,415 | 6/1974 | Evans et al. | 228/180.2 |
| 4,451,541 | 5/1984 | Beal | 228/263.11 |
| 5,052,155 | 10/1991 | Blacks et al. | 51/413 |

FOREIGN PATENT DOCUMENTS 0009789  1/1987  Japan ................................ 228/205

*Primary Examiner*—Richard K. Seidel
*Assistant Examiner*—James Miner
*Attorney, Agent, or Firm*—Norman E. Lehrer; Franklyn Schoenberg

[57] ABSTRACT

A method is provided for soldering using tin-containing solder to substrate surfaces that are gold plated wherein a selected portion of the gold plated surface is treated by impacting with a high velocity stream of fine nickel containing abrasive particles to remove all the gold from the treated surface and then effecting joining to the treated surface by conventional soldering techniques.

13 Claims, 5 Drawing Sheets

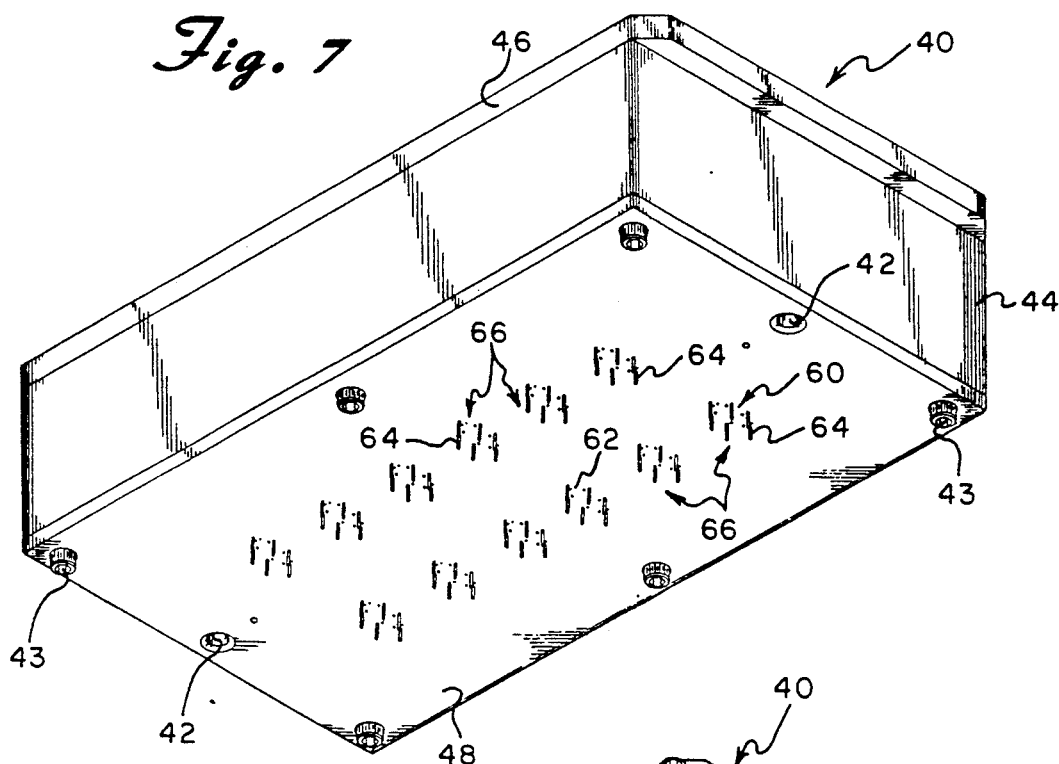
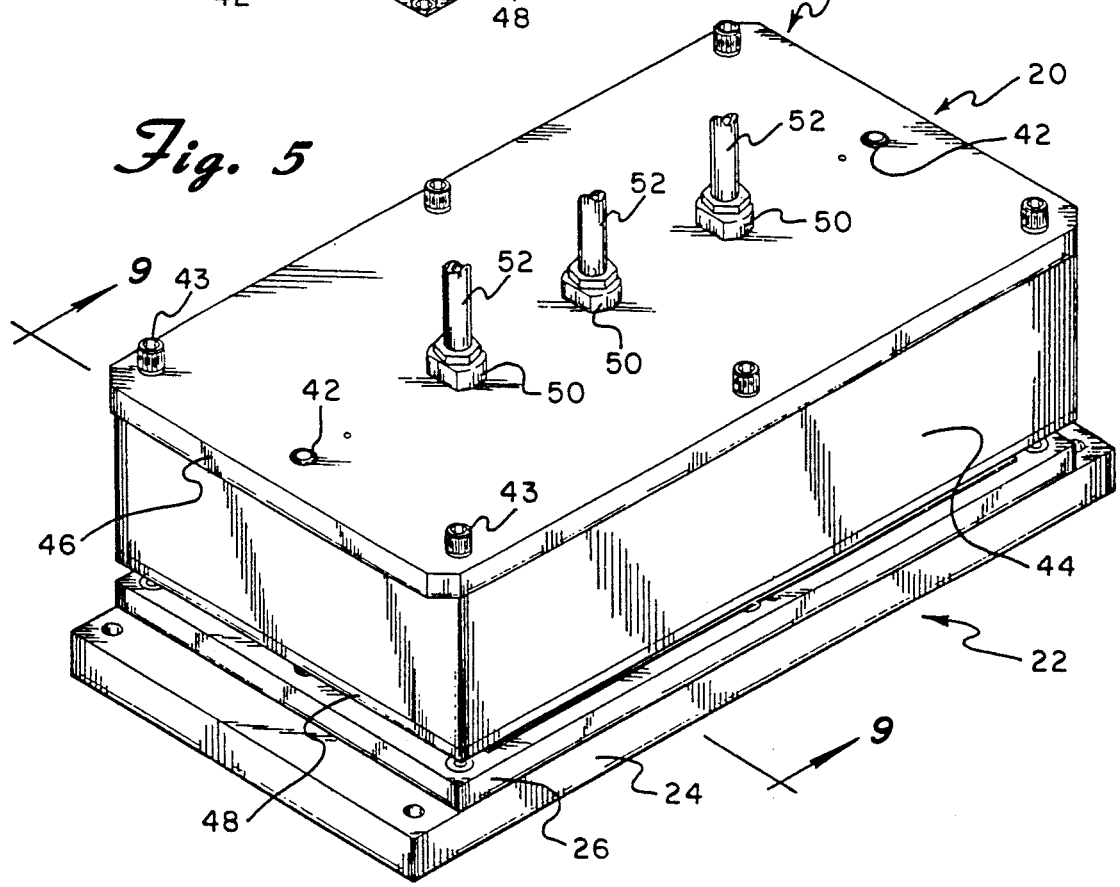

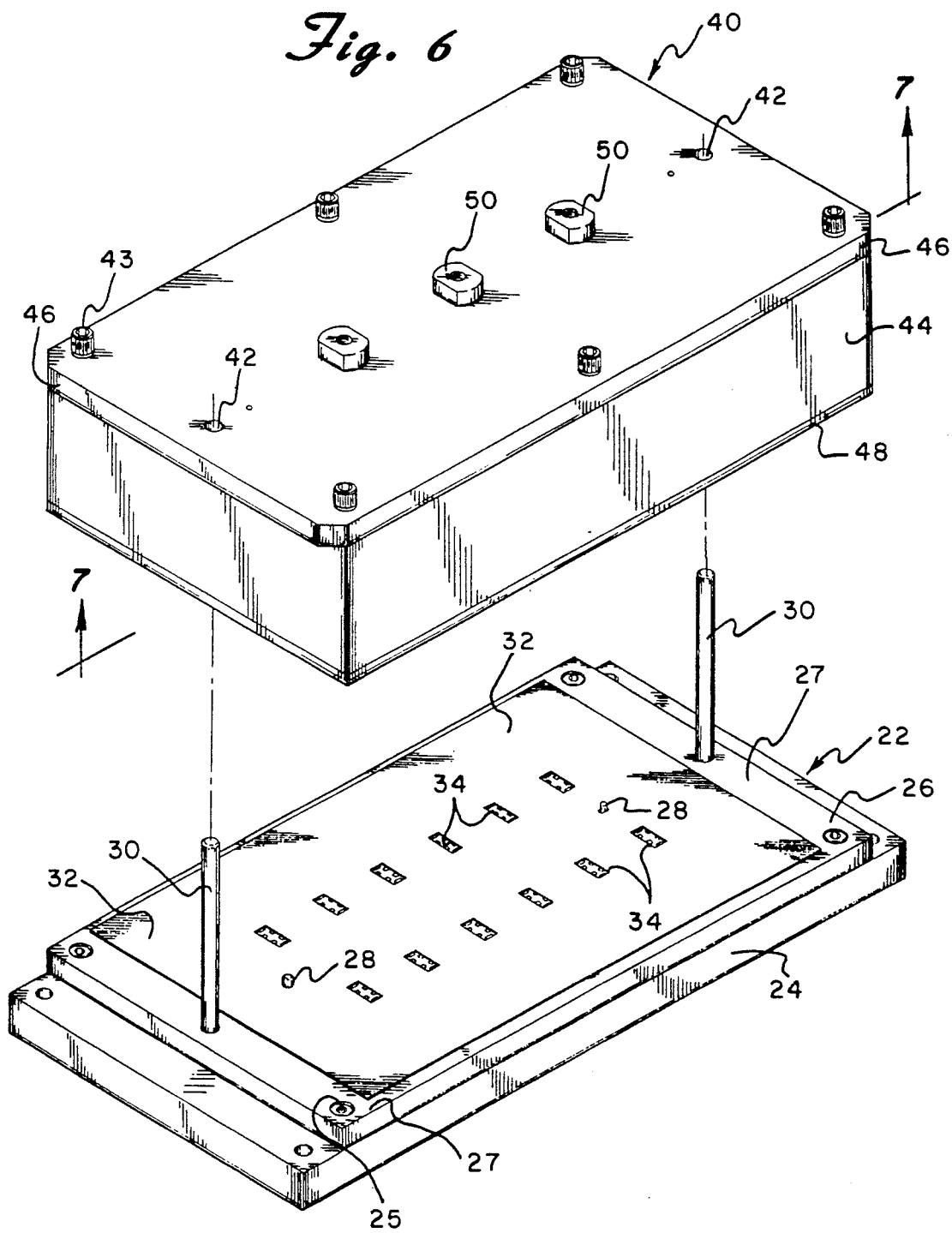

5,169,057

METHOD FOR SOLDERING AND APPARATUS THEREFOR

This is a division of prior application Ser. No. 391,817, filed Aug. 10, 1989, now U.S. Pat. No. 5,052,155.

FIELD OF THE INVENTION

The present invention relates to soldering as a means of joining to gold plated substrates and, more particularly, to a method and apparatus for joining by soldering to gold plated substrates including elements of electronic components and devices and the like such as "leads," terminals (terminations), etc. using tin-containing solder.

BACKGROUND OF THE INVENTION

There are many applications in which electronic components, devices and the like have a variety of parts including "leads," contacts and similar connecting elements which are plated with a thin layer of gold (about 50 microinches or even more) to enhance the electrical quality and environmental resistance of the circuits involved. Electrical quality and reliability of the various elements and/or components in the circuits play a major role in the suitability thereof and of the devices and systems in which they are employed. Quality and reliability frequently depend on the type of connecting elements used and the means used to join them.

Soldering is a widely used technique for readily joining elements of electrical circuits in both mass production and hand assembly operations. The structure and composition of the elements, such as the "leads," to be joined as well as the type, size and mode of operation of the circuit and components thereof are factors in determining the suitability of known soldering techniques and materials. For example, the strength and reliability of the joint frequently depends on both the composition of the elements to be joined and of the joining material such as the solder; the type and/or size of elements in an electronic component must be considered when establishing the time and temperatures that can be employed in the joining operation; service conditions and accessibility relate to the materials and temperatures required for the joining techniques and suitability thereof in mass production operations.

A widely used soldering technique for electronic components employs tin-containing solder whereby joining can be carried out rapidly at relatively low temperatures, e.g. about 400° F. However, as is known, joining with a tin-containing solder to surfaces over which even a flash coating (about 10 to 30 microinches) of gold has been applied results in embrittlement and ultimate failure of the gold-tin solder joint over a period of time by virtue of the interaction of the gold and tin. Thus, the strength, time and temperature advantages of this type of joining technique are not readily available for a large number of electronic components where gold plating of the surfaces is required.

Numerous attempts have been made over the years to overcome the problem of soldering to gold plated surfaces, but to date no routine or economically feasible procedures and/or solder materials have been developed which afford the strength, reliability and other advantages of basic tin-containing solders. Moreover, in those cases where the use of high temperatures would be detrimental to the electronic components or substrates, it has been necessary to employ complicated and costly mechanical or chemical procedures for joining to those surfaces which are required to be gold plated. For example, one such procedure involves masking portions of the part before gold plating to limit the coating to areas where joining to the surface would not be needed. Masking and then removal of the masking before assembly and related operations greatly increase the complexity and costs, particularly when mass production of large quantities of small parts is involved.

Mechanical abrading, reforming, compacting and cleaning of articles made of metals, ceramics, refractory materials or plastics by "sand-blasting" and analogous high velocity impacting treatment procedures are well known and widely used. This manner for treatment of generally hard surfaces typically involves bombardment of them with fine grains of abrasive materials at high velocity utilizing a jet of compressed air or other suitable fluid. While the term "sandblasting" has generally attained a generic meaning for treating the surfaces of articles by high velocity impacting with granular or particulate abrasive materials, the treatments used involve a wide range of different apparatus and procedures as well as many different types, sizes and shapes of abrasive materials depending on the application, such as the type and composition of the materials being treated, and the purpose of the treatment.

Quartz sand used for blasting parts in the past with the aid of compressed air, in general, has been found to be unsuitable for environmental reasons as well as being subject to premature breaking when impacting metal surfaces In U.S. Pat. Nos. 2,145,756, 2,336,001, 2,362,310, 2,600,358, 2,670,281, 2,773,339, 2,796,338, 3,188,776, 4,035,962, 4,289,541 and Re. No. 31,883 are disclosed examples of some of the many metallic materials used as particulate abrasives for "sand blasting" and grinding treatment of the surfaces of metal articles including slabs, sheets and castings. None of these patents deal with the problem of joining to surfaces to be or that have been gold plated, or to apparatus for the preparation of parts used in electronic components.

More recently, "sand blasting" and analogous techniques have been used for a variety of non-metal treating applications including, for example, removing insulation from insulated wires as disclosed in U.S. Pat. No. 3,636,623, and as a finishing step for plastic parts such as removing flash or excess material from molded parts including electronic components as disclosed in U.S. Pat. Nos. 4,545,155, 4,555,876 and 4,561,219. In such applications, special apparatus and fixtures are used for controlling the area treated with various different types of abrasive materials, typically of special composition, size and shape. Here again, the problem of joining to gold plated surfaces is not dealt with, nor is there a suggestion of any method which may be suitable, although the treatment of substrate surfaces to be coated and the finishing of coated surfaces of electronic components are disclosed.

SUMMARY OF THE INVENTION

It is an object of the present invention to provide a method for readily joining by soldering to gold plated surfaces using tin-containing solders which is efficient and results in strong, reliable solder joints using mass production and manual operations.

It is a further object of the present invention to provide a method for readily joining by soldering to gold plated surfaces of elements in electrical circuits of electronic components using tin-containing solders, wherein the tin-containing solder joint is strong and reliable and can be effected by mass production operations.

It is a still further object of the present invention to provide a method for readily soldering to the gold plated surface of an electronic component using a tin-containing solder by removing gold plate from only the portion of the surface of the component where joining is to be effected without disturbing the electrical quality achieved by the gold plate on the surface of the electronic component.

It is another object of the present invention to provide a method for treating gold plated surfaces of electronic components and the like by high velocity impacting with particulate abrasive materials to effect removal of the gold plate from a selected portion of the surface of the component to permit the preparation of strong, reliable solder joints with the surface of the component using a tin-containing solder.

It is still another object of the present invention to provide an apparatus for the treatment of a selected portion of the gold plated surface of an article, preferably the removal of gold plate from the surface of the article, by the high velocity impact with a particulate abrasive material, which includes a support for the article to be treated, a masking for the article outlining the particular portion of the surface of the article to be treated, and a manifold chamber spacedly mounted over the support for said article which is adaptable for receiving a supply of particulate abrasive material and admixing therewith a fluid suitable for the high pressure and velocity dispensing of said abrasive material, said manifold chamber having at least one inlet port for the ingress of high pressure fluid such as a compressed gas into said manifold chamber and at least one dispensing nozzle for said abrasive material disposed in said manifold chamber in vertical register with the portion of the surface of the article to be treated.

Still another object of the present invention is to provide a particulate abrasive material for the high pressure and velocity impact treatment of hard surfaces, such as the gold plated surface of articles, by which the required treatment thereof may be effected, such as removal of the gold plate from selected portions of the articles surface, and whereby strong, reliable solder joints may be obtained directly with the treated surface using tin-containing solder without the need for further treatment that attends the use of other known impacting materials.

In accordance with the present invention there is provided a method for joining to the gold plated surface of an article by soldering with a tin-containing solder which comprises: providing a supported substrate or member such as an article with a gold plated surface, e.g. an electrical lead for an electronic component; effecting the removal of said gold plate from a selected portion of the surface of said substrate, preferably substantially only the area to which joining by soldering is intended, by impacting said supported gold-plated substrate with a high pressure stream of fluid-borne, preferably airborne, abrasive material comprising nickel or nickel-containing particles; and effecting joining to the gold-free portion of the surface of said substrate by soldering thereto with a tin-containing solder.

Soldering to the surface of the article in the area where gold plate has been removed can be readily carried out using conventional soldering techniques (time and temperature). Surprisingly and unexpectedly it has been found that a strong, reliable solder joint will be directly formed with the substrate without detracting from the appearance and electrical or environmental advantages achieved by gold plate covering the other portions of the substrate or article. In accordance with the practice of the invention, for example, gold plated lead frames prepared with a large number of electrical "leads" by conventional methods, can be readily treated for removal of the gold plate from a selected portion of each of the "leads" and then joined to elements of the electrical circuit by conventional tin-containing soldering techniques. The method of the invention may be employed with elements of miniature electronic circuits and components and may be effected by manual or mass production operations.

In another aspect of the invention, there is provided an apparatus or device for treating the gold plated surface of an article by the high pressure impacting thereof with a particulate abrasive material which comprises: support base means for an article to be treated, preferably a flat, thin self-supportable sheet member; masking means adapted to be disposed over the supported article to be treated with at least one selected portion of the surface of the article exposed; and manifold chamber means adaptable to receive a quantity of particulate abrasive material and to effect admixture thereof with a fluid under high pressure, preferably compressed air, said manifold chamber means including at least one connector means for ingress of a fluid under high pressure, at least one nozzle means for dispensing at high pressure and velocity a fluid-borne particulate abrasive material from within said chamber and means for engaging said masking means about a portion of the surface of the article to be treated, said manifold chamber means being movably mounted over said base support means and spaced therefrom with said nozzle means and said means for engaging said masking means in substantial register with the portion of the surface of the article to be treated.

The apparatus of the invention can be readily used to treat the surface of a flat article such as a lead frame having a plurality of electrical leads interconnected for initial handling. Such lead frames, which have the surface(s) thereof gold plated to meet electrical requirements, can be treated using the apparatus of the invention to remove gold plating from selected portions of their surface by blasting with abrasive particles in preparation for the joining thereof by soldering with a tin-containing solder.

In still another aspect of the present invention there is provided a metallic abrasive and blasting material for treating hard surfaces by being continually hurled at high velocity against such surfaces comprising selectively sized fine particles of nickel or nickel-containing alloys such as nickel-chromium and nickel-vanadium, wherein nickel is the primary component of such alloys. It has been surprisingly and unexpectedly discovered that such nickel or nickel-containing particles possess a distinctive combination of properties, including high density, configuration, hardness, and break-down resistance which enable it to be used with effectiveness as a surface impact treating agent for many substrates and materials in conjunction with soldering and the like operations which may be used to join to the treated surfaces.

Other objects and advantages of the present invention will become apparent from the detailed description thereof taken in conjunction with the drawings.

BRIEF DESCRIPTION OF THE DRAWINGS

For the purpose of illustrating one aspect of the invention, there is shown in the accompanying drawing one form which is presently preferred; it being understood that the invention is not intended to be limited to the precise arrangements and instrumentalities shown.

FIG. 5 is a perspective view of an abrasive blasting apparatus in accordance with the invention;

FIG. 6 is an exploded perspective view of the apparatus of FIG. 5;

FIG. 7 is a perspective view illustrating the manifold chamber of the apparatus of FIG. 5 taken along the line 7—7 of FIG. 6;

DETAILED DESCRIPTION OF THE PREFERRED EMBODIMENTS

The present invention is predicated upon the discovery that joining to gold plated surfaces of various articles such as components used in electrical circuits can be readily effected by conventional soldering techniques using tin-containing solders when the gold plate is completely removed from selected portions of the surface of the substrate by high velocity impact treatment with particulate nickel and nickel-containing alloys abrasives.

Figure 1:
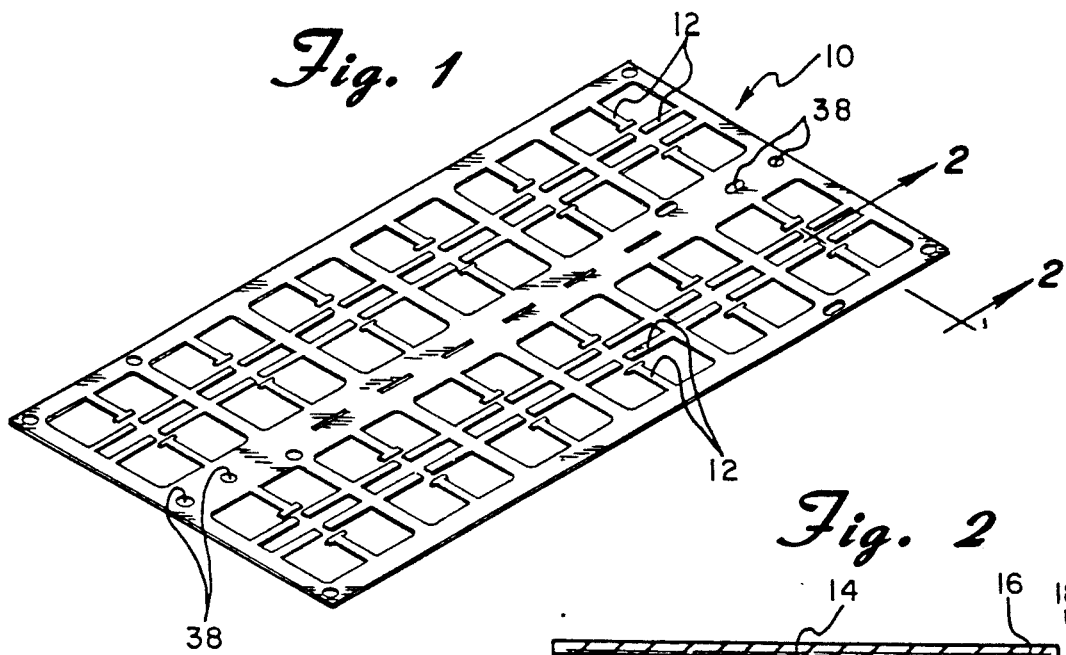
FIG. 1 is a perspective view of a gold plated "lead frame" showing an article of the type which can be treated according to the present invention.
Figure 2:
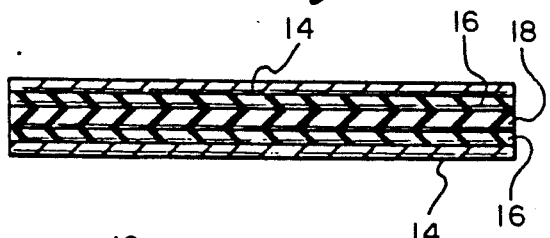
FIG. 2 is an enlarged and fragmentary sectional view taken along the line 2—2 of FIG. 1.

Referring now to the drawing, where like reference numerals identify like parts, there is illustrated in FIGS. 1 and 2 a metal plate shown generally as 10, which is comprised of an array of a plurality of spaced electrically conductive leads 12 formed therein, which plate is conventionally referred to as a "lead frame." The leads 12 are intended for use as elements of the circuitry of electronic components, for example, PILL type stripline terminations (not shown). During the manufacture of such components, selected lead elements 12 of the array in the frame 10 will be joined at designated points of the electric circuit, following which the plate is cut to separate the free ends of the joined leads 12 therefrom resulting in a finished component. Intermediate the array of leads 12 are spaced holes 38 which may serve to position and hold the "lead frame" 10 during treatment of the surface and/or assembly of the components.

The lead frame 10 includes a copper metal base or substrate 18 over which is plated a thin barrier layer of nickel 16 and then a thin layer of gold 14 (at least about 50 microinches). Gold plating of electronic components is frequently required to insure the electrical quality and reliability of the circuitry for extended periods of storage and use. As indicated, it is well known that when soldering by conventional techniques with tin-containing solder to surfaces on which even trace amounts of gold may be present, interaction of the gold and tin results in the ultimate embrittlement and failure of the tin-gold joint.

In accordance with the invention there is provided a method for treating the surface of gold plated articles such as leads 12 arrayed in a lead frame 10 to readily permit soldering to the surface of such articles with tin-containing solder which comprises: supporting the article to be treated such as the lead frame 10 which has a gold plated surface; and effecting the removal of the gold plate from selected portions of a surface of the supported lead frame, preferably only the area of the surface of the leads 12 to which joining by soldering is intended, by impacting said supported lead frame 10 with a high pressure stream of fluid-borne, preferably airborne, abrasive material comprising particles of nickel, nickel-containing alloys and mixtures of the same, preferably while the lead frame is held securely and accurately positioned relative to the pressurized stream of abrasive particles.

Figure 3:
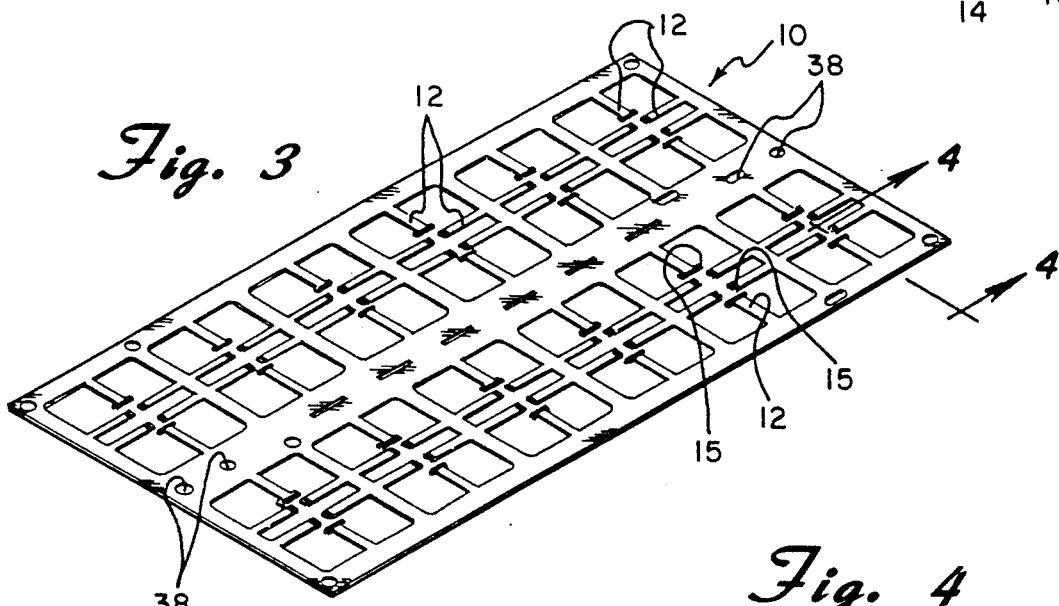
FIG. 3 is a perspective view of the lead frame article of FIG. 1 after treatment of selected portions of the surface thereof in accordance with the process of the invention and to which joining by soldering can be effected.
Figure 4:
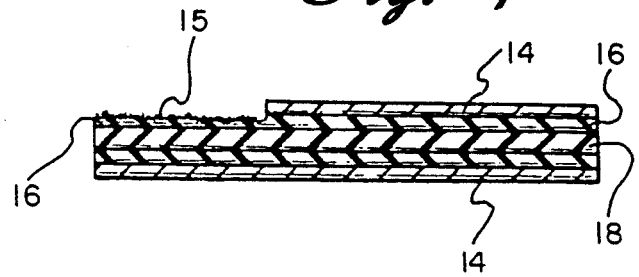
FIG. 4 is an enlarged and fragmentary sectional view taken along the line 4—4 of FIG. 3.
Figure 8:
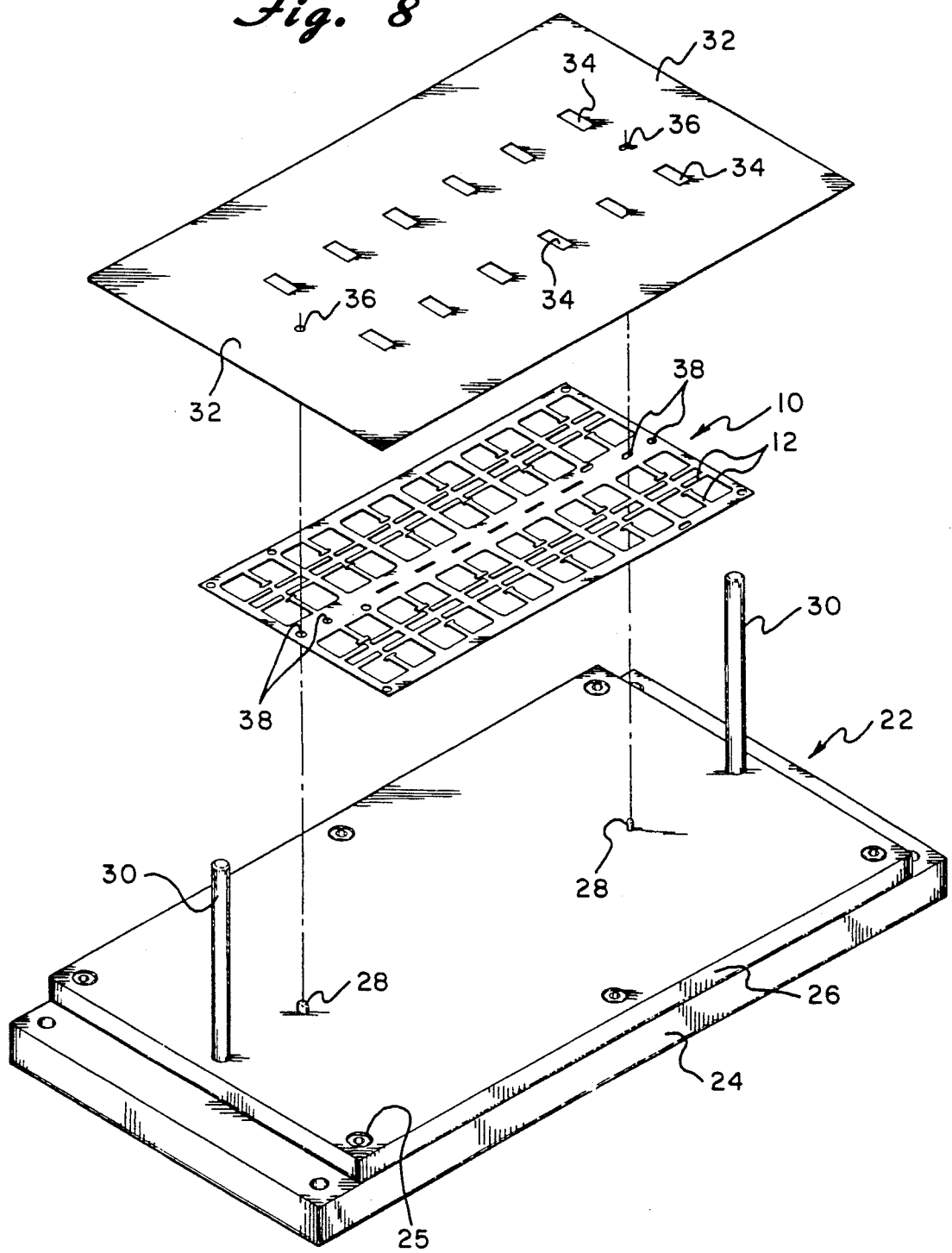
FIG. 8 is a partial exploded perspective view of the apparatus of FIG. 5.
Figure 9:
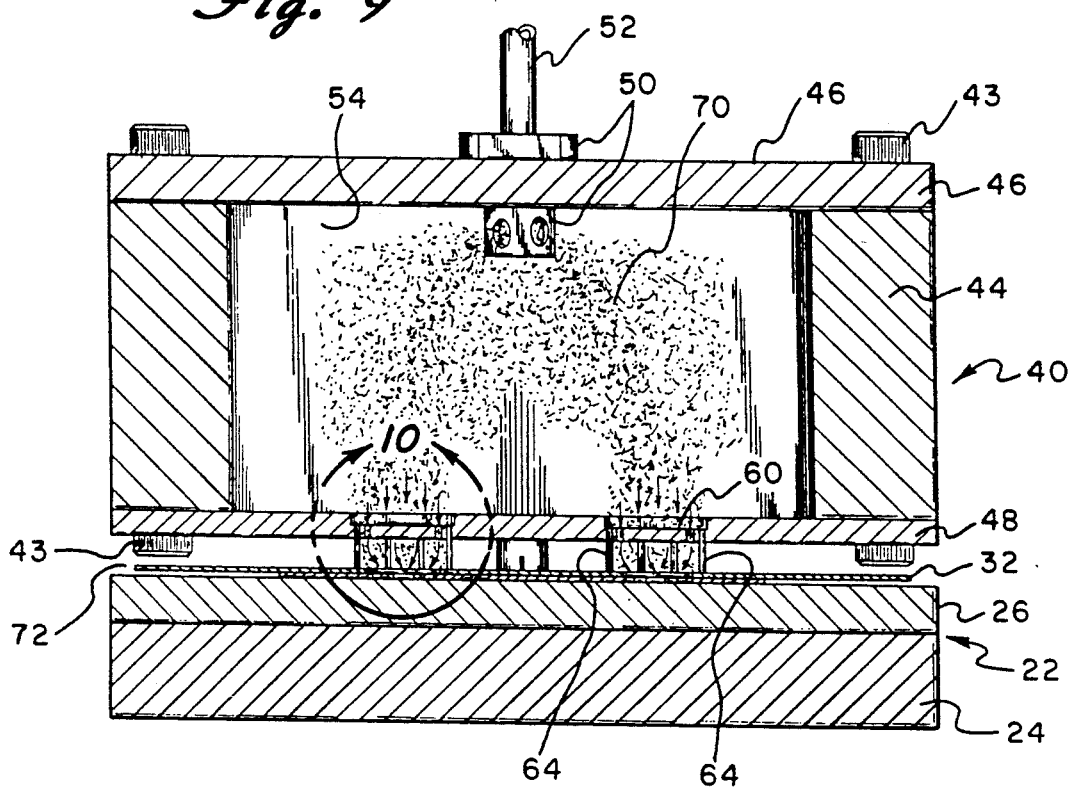
FIG. 9 is an enlarged sectional view taken along line 9—9 of FIG. 5.
Figure 10:
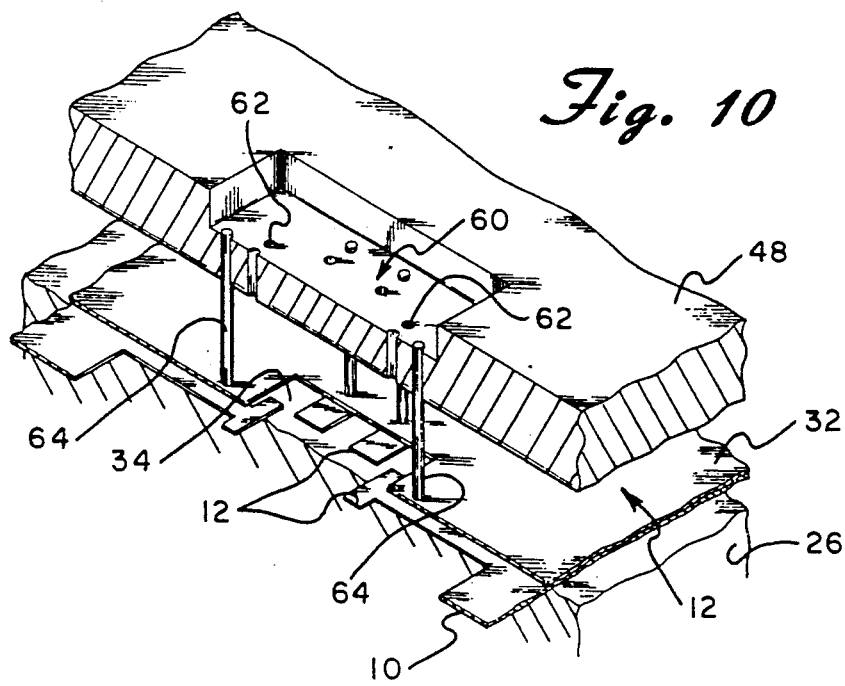
FIG. 10 is an enlarged and fragmentary perspective sectional view taken along line 10 of FIG. 9.

In FIGS. 3 and 4 there is illustrated the lead frame 10 which has been treated in accordance with the practice of the invention by high pressure impacting with particulate abrasive materials to the extent that the layer of gold plate 14 has been completely removed from selected portions of one surface 15 of the leads 12 together with a portion of the nickel plate coating 16 on the copper substrate 18. The untreated gold plated surfaces of the leads 12 and lead frame 10 are not changed in performance or appearance. Joining to the treated surface 15 of the leads 12 by soldering with a tin-containing solder may then be readily effected to form a strong joint therewith without any detriment to the untreated surfaces of the leads or embrittlement of the solder joint on the surface of the leads.

According to the present invention, in order to treat the surfaces of gold plated substrates such as electrical leads without detriment to the elements or to the treated surfaces, yet effecting complete removal of the gold plate from selective portions of the surface without any detrimental residue clinging thereto, it is important that nickel containing particles or "powder" of appropriate grain size be used as the abrasive medium for the surface treatment. Generally speaking, a stream of nickel or nickel alloy particles are projected upon the work piece at high velocity in a blasting technique analogous to "sand blasting" and impacting by the abrasive particles removes gold plate from the treated surfaces.

The abrasive particles are propelled at high velocity by a fluid stream, preferably compressed gas or air at about 30 to 90 psi. Nickel powder or particles, powder or particles of nickel alloys such as nickel-copper, nickel-chromium, nickel-vanadium and the like wherein nickel is the primary component, or mixtures thereof are satisfactory for the purposes of the invention. In general, the nickel and nickel-containing particles or powder are used directly, i.e., not crushed and used as grit.

While the size of the nickel particles or powder and the amount thereof in the fluid stream useful in accordance with the invention is not critical and generally depends on the type and size of the substrate and thickness of gold plate, for purposes such as treating the surface of lead frames 10, extremely fine nickel particles or powder in the sieve size range of 200 to 325 (0.074 mm to 0.044 mm) are especially advantageous. In general, the fluid stream will contain about 90% to 95% by weight of the abrasive particles and about 5% to 10% by weight of carrier.

The length of time required for treatment of a surface with a high velocity stream of abrasive particles in accordance with the invention is generally quite short, e.g., 40 seconds or less, and may be readily determined by routine experimentation. After treatment in accordance with the invention of selected portions of the surface of gold plated substrates, all of the gold plate has been removed without undesirable residue of the abrasive material remaining and the treated surfaces are in condition for directly forming a strong solder joint therewith using a tin-containing solder such as 95:5 tin/silver and 60:40 tin/lead. Such solder joints are not subject to embrittlement by virtue of the reaction of gold and tin, nor are adjacent untreated gold plated surfaces compromised as to long term electrical and environmental quality or appearance.

Referring now to FIGS. 5-10, there is illustrated an abrasive blasting apparatus or device, shown generally as 20, in accordance with the present invention for performing the high velocity impact treatment of gold plated articles such a lead frames 10 which comprise a plurality of leads 12. The apparatus 20 includes a support base 22 having an article support plate 26 fastened over a base plate 24 by conventional means such as screws 25 or the like and a manifold chamber 40 which is removably mounted on the support base 22 in a predetermined spaced relationship. All parts of the apparatus 20 can be fabricated from stainless steel or other abrasion resistant metal.

The article support plate 26 has a planar top surface 27 large enough to support thereon a flat article or workpiece to be treated, such as a "lead frame" 10, and a mask 32 for defining the surface of the lead frame to be treated. Mask 32 is a thin metal sheet fabricated from stainless steel or the like having an array of spaced cut-outs 34 therethrough which is designed to be supported on the support plate over the work piece 10. Outwardly extending from the top surface 27 of support plate 26 are two sets of spaced alignment pins, 28 and 30, which are secured to support plate 26. Spaced alignment pins 28 serve to position and hold the lead frame 10 with mask 32 superimposed thereover upon the surface 27 of support plate 26 by virtue of being in register with holes 38 through the frame 10 and holes 36 through the mask 32. Such pins 28 are of a length suitable to hold the superimposed lead frame 10 and mask 32 thereon yet not interfere with the spaced positioning of a manifold chamber 40 thereover. Elongated, spaced alignment pins 30 serve to position and support the manifold chamber 40 relative to the lead frame 10, the mask 32, and the support base 22 during operation of the apparatus.

Manifold chamber 40 is comprised of a frame 44, a top plate 46 and a generally planar bottom plate 48 which are secured together by conventional means such as screws 43 to enclose a pressure chamber 54 within which a quantity of particulate abrasive material and gas under high pressure may be suitably retained and mixed. Spaced holes 42 through the top plate 46, the opposing short ends of the frame 44 and the bottom plate 48 are aligned when manifold chamber 40 is assembled as shown and, as indicated, are in register with the elongated alignment pins 30 extending from the support base 22. Secured to and extending through the top plate 46 of the manifold chamber 40, are inlet and dispersing connectors 50 for the supply of a mixture of compressed gas and abrasive particle 70 into pressure chamber 54 which may also be used as inlets for a supply of abrasive particles 70 and/or compressed gas into pressure chamber 54. Such compressed gas, abrasive particles and/or mixtures thereof are supplied through supply lines 52 from conventional sources (not shown) during operation of the apparatus.

Located within the base plate 48 of manifold chamber 40 and extending therethrough are a plurality of spaced nozzle assemblies 60 for dispensing streams of abrasive particles from within the pressure chamber 54. Each of the nozzle assemblies 60 comprises a plurality of spaced orifices 62, each orifice 62 being in general alignment with a portion of the surface of the workpiece to be treated, thus serving to more uniformly distribute the high velocity streams of abrasive particles issuing from the manifold chamber 40 over the plurality of surfaces of the lead frame 10 to be treated. The diameter of the orifices 62 may vary depending, for example, on the particle size of the abrasive materials, the size of the surface to be treated, the thickness of gold plate, etc. In general, orifices of a diameter ranging from about 0.015" to 0.040" may be advantageously employed. It would be evident that the type, location and construction of the nozzle assemblies may vary depending on the type and size of article to be treated as well as the particular construction of the manifold chamber used.

Also secured to the bottom plate 48 of manifold chamber 40 are a plurality of spaced, parallel, elongated rods 64 with the free ends thereof extending outwardly a substantially equal length. The rods 64 extend from the bottom plate 48 in a series of arrays 66, with each array 66 thereof generally located within the periphery defined by a nozzle assembly 60 in the bottom plate, but somewhat outside the periphery defined by the orifices 62 in each of the nozzle assemblies 60 and the periphery of each cut-out 34 in the mask 32. As shown, the rods 64 serve to position the manifold chamber 40 in generally uniformly spaced relation 72 to the support base 22 as well as securing the edges of the cut-out portions 34 of the mask 32 against the work piece 10 and the support base 22. The length of the rods 64 and, thus, the spacing may vary depending on the application, size of the abrasive particles, the pressure and velocity of the fluid used. In general, spacing 72 which is close enough for application of the necessary impact energy to the surface being treated yet permitting the ready removal of spent abrasive particles from the article being treated and from the nozzle exits is preferred and typically may advantageously range from about ⅛" to ⅜", or even greater.

In FIGS. 5 and 8-10 are shown a preferred method of treating an article such as a lead frame 10 in accordance with the practice of the invention employing an embodiment of the apparatus of the invention 20. Assembly of the blasting apparatus 20 with manifold chamber 40 mounted on alignments pins 30 over a lead frame 10 and mask 32 supported on the base support 22, serves to position the manifold chamber 40 in a generally uniformly spaced relationship with respect to the base support 22 and the lead frame 10, which spacing (i.e., 3/16" to ¼") is sufficient to permit the stream of abrasive particles to be exhausted from the surface of the work piece. Further, the nozzle assemblies 60 are in general alignment with the exposed areas of the surface of the leads 12 and the free ends of the rods 64 engage the mask 32 about the cut-out portions 34 therethrough to secure the edges thereof against the lead frame 10 and the support base 22.

When the apparatus 20 is assembled with the lead frame 10 and mask 32 positioned thereon, a supply of a mixture of abrasive particles and compressed air at a pressure of about 40 to 60 psi is fed through supply lines 52 and inlet and dispersing connectors 50 from a source thereof into pressure chamber 54 wherein a uniform admixture in generally desired portions of particles and gas is maintained. The pressure chamber 54 rapidly reaches the pressure of the feed gas at which time streams of high velocity abrasive particles issue from each of the nozzle orifices 62 to impact the surface of the lead frame 10 to be treated. After a short period of time, e.g. 20 to 30 seconds, the compressed air feed is shut off and the apparatus 20 is disassembled for removal of the treated lead frame. It has been surprisingly found that no undesirable residue of the abrasive materials cling or are embedded in the treated surfaces and conventional soldering techniques can then be employed in joining the treated leads to the desire circuitry of electronic components and the like.

It would be evident to one skilled in the art that modifications to the apparatus using well known techniques may be made which would permit the assembly and operation thereof to be readily performed by manual or automated means and for the process of the invention to be carried out in mass production operations.

Having thus described the invention in relation to the drawings hereof, it will be clear that modifications could be made in the preferred embodiments without departing from the spirit of the invention. Accordingly, it is not intended that the words used to describe the invention be limiting thereof nor should the drawings be considered so. It is intended that the invention be limited only by the scope of the appended claims.

What is claimed is:

1. A method for joining to an article having a gold plated surface thereon by soldering with a tin-containing solder which comprises:
    a) providing an article with a gold plated coating on a surface thereof to be treated and supporting said article; and
    b) effecting removal of said gold plated coating from a selected portion of a surface of said article by impacting said selected portion of the surface of the supported article with a high pressure stream of fluid-borne abrasive material comprising nickel-containing particles, wherein said selected portion of the article surface impacted by a high pressure stream of fluid-borne particles is adaptable for forming a strong solder joint therewith using a tin-containing solder.

2. The method according to claim 1 which includes effecting joining to the portion of the surface of said article impacted by said high pressure stream of fluid-borne abrasive material by soldering thereto with a tin-containing solder.

3. The method according to claim 1, wherein said article is a flat substrate.

4. The method according to claim 1, wherein said article having a gold plated surface thereon is a lead frame comprised of a plurality of spaced electrical leads.

5. The process according to claim 1, wherein said selected portion of said surface is treated with a high pressure stream of airborne abrasive material.

6. The method according to claim 5, wherein said abrasive material is selected from the group consisting of particles of nickel, nickel alloys and mixtures thereof.

7. The method according to claim 5, wherein said abrasive material comprises extremely fine particles in the sieve size range of about 200 to 325.

8. The method according to claim 5, wherein said abrasive material comprises extremely fine particles of nickel.

9. The method according to claim 1, wherein said high pressure stream of fluid-borne abrasive material contains between about 90% and 95% by weight of said abrasive material.

10. The method according to claim 1, wherein said high pressure stream of fluid-borne abrasive material is propelled at high velocity by compressed gas or air at from about 30 psi to 90 psi.

11. The method according to claim 1, wherein removal of said gold plated coating from a selected portion of the surface of said article is effected by impacting said selected portion of the surface of the supported article with a high pressure stream of airborne abrasive material until said gold plated coating is completely removed from said selected portion of the surface of the article.

12. The method according to claim 11, wherein said gold plated coating is only removed from portions of the surface of the article to which joining by soldering is intended.

13. The method according to claim 12, which includes effecting an electrical connection to portions of said article surface from which gold plated coating has been removed by soldering thereto with a tin-containing solder, wherein an electrical connection is effected which is not subject to embrittlement.

* * * * *